(12) United States Patent  
Ahmad

(10) Patent No.: US 7,230,835 B1  
(45) Date of Patent: Jun. 12, 2007

(54) APPARATUS FOR REDUCING SIGNAL REFLECTION IN A CIRCUIT BOARD

(75) Inventor: Bilal Ahmad, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 291 days.

(21) Appl. No.: 10/623,216

(22) Filed: Jul. 18, 2003

(51) Int. Cl.
*H05K 1/11* (2006.01)
*H05K 1/14* (2006.01)

(52) U.S. Cl. ............... 361/794; 361/780; 361/795; 174/262; 174/265

(58) Field of Classification Search ........ 174/255–268; 361/792–795
See application file for complete search history.

(56) References Cited

U.S. PATENT DOCUMENTS

| | | | | |
|---|---|---|---|---|
| 5,272,600 A | * | 12/1993 | Carey | 361/792 |
| 5,363,280 A | * | 11/1994 | Chobot et al. | 361/794 |
| 5,488,540 A | * | 1/1996 | Hatta | 361/794 |
| 5,784,262 A | * | 7/1998 | Sherman | 361/777 |
| 6,064,113 A | * | 5/2000 | Kirkman | 257/691 |
| 6,229,095 B1 | * | 5/2001 | Kobayashi | 174/255 |
| 6,418,032 B2 | * | 7/2002 | Hirata et al. | 361/780 |
| 6,452,379 B1 | | 9/2002 | Cartier | 324/158.1 |
| 6,535,005 B1 | | 3/2003 | Field | 324/755 |
| 6,639,154 B1 | | 10/2003 | Cartier et al. | 174/255 |
| 6,909,052 B1 | * | 6/2005 | Haug et al. | 174/255 |

\* cited by examiner

*Primary Examiner*—Tuan Dinh
(74) *Attorney, Agent, or Firm*—BainwoodHuang

(57) ABSTRACT

A circuit board has, in a first signal layer, a signal conductor having a relatively small width and a contact pad having a relatively large width. The relatively large width of the contact pad combined with the relatively narrow signal conductor creates an impedance mismatch between the contact pad and the signal conductor. The circuit board has, in a second signal layer, a ground plane separated from the first signal layer by a nonconductive layer. The circuit board defines an opening in the second signal layer underneath the contact pad. The presence of the ground plane underneath the contact pad typically affects the impedance of the contact pad. The opening in the second signal layer removes a portion of the ground plane relative to the contact pad and, therefore, reduces the impedance mismatch between the contact pad and the signal conductor. Such reduction in the mismatch of the impedances between the contact pad and the signal conductor minimizes signal reflection of a signal transmitted through the signal conductor and across the contact pad.

19 Claims, 8 Drawing Sheets

APPARATUS FOR REDUCING SIGNAL REFLECTION IN A CIRCUIT BOARD

BACKGROUND

A typical circuit board includes layers of conductive material (e.g., copper) and nonconductive material (e.g., fiberglass) sandwiched together to form a single, rigid board. Some circuit boards include many layers of alternating conductive and nonconductive materials.

In general, to manufacture a circuit board having multiple layers, a circuit board manufacturer creates separate circuit board sheets. Each circuit board sheet typically includes two conductive signal layers and a nonconductive separating layer disposed between the conductive signal layers. The manufacturer typically aligns multiple circuit board sheets along with other nonconductive sheets (e.g., nonconductive core layers) in an interleaved manner and laminates the sheets to form a single, integrated board.

A typical circuit board includes, as one of the signal layers, ground planes and power planes to provide power to the circuitry of the circuit board (e.g., circuit board components). A ground plane is a generally contiguous signal layer that carries a power supply ground signal (e.g., a reference voltage such as zero volts or chassis ground) from an external power supply to the circuit board circuitry. A power plane is also a generally contiguous signal layer that carries a power supply voltage signal (e.g., a DC voltage at a predetermined potential difference from the ground signal) from the power supply to the circuit board circuitry.

The typical circuit board includes, as one of the conductive signal layers, a data signal layer that carries data signals containing information for controlling the operation of the circuit board. Such a data signal layer typically includes conductive traces (e.g., data signal traces) that connect circuit board components mounted on the circuit board. Manufacturers conventionally include, as part of the data signal layer, conductive pads electrically connected to the conductive traces. The conductive pads provide a contact interface for a circuit board testing device, such as a bed of nails testing device. The conductive pads, therefore, allow a manufacturer to verify the integrity and continuity of the conductive traces of the circuit board (e.g., test for shorts in the conductive traces) prior to high volume manufacturing and shipping of the circuit board.

Certain conventional conductive pads electrically attach to a conductive trace by way, of conductive stubs. The conductive stub locates the conductive pad at a distance away from the conductive trace to provide a circuit board testing device access to the conductive pad. For example, assume a circuit board component is positioned in relative proximity to a conductive trace. A manufacturer utilizes the conductive stub to electrically connect the conductive pad to the conductive trace at a distance away from both the conductive trace and the circuit board component. The conductive stub, therefore, limits the circuit board component from interfering with a circuit board testing device's access to the conductive pad. Other conventional conductive pads electrically attach to a conductive trace via direct contact between the conductive pads and the conductive trace and without the use of a conductive stub. For example, conventional conductive pads are centered relative to the conductive trace.

SUMMARY

Conventional techniques for utilizing conductive pads of a circuit board suffer from a variety of deficiencies.

For example, as described above, conventional circuit boards include a data signal layer having conductive traces that connect circuit board components mounted on the circuit board and conductive pads electrically connected to the conductive traces. The impedance of the conductive trace relative to the impedance of the contact pad affects a signal transmitted through the conductive trace and across the contact pad.

Several characteristics of the circuit board affect the impedance of the conductive traces and conductive pads on the circuit board. For example, the width of the conductive traces and conductive pads, the thickness of the conductive traces and conductive pads (e.g., the height of the conductive trace relative to a surface of the circuit board), the distance between the conductive traces, the conductive pads and the ground plane of the circuit board, and the relative permittivity of the nonconductive layer between the ground plane and the conductive traces and conductive pads all influence the impedance of the conductive traces and pads.

An impedance mismatch between the contact pad and the conductive trace creates signal reflection of a signal transmitted through the conductive trace and across the conductive pad. Such a signal reflection degrades the quality of the signal.

In the case where the conductive pad electrically connects to the conductive trace by the conductive stub, an impedance mismatch exists between the conductive pad, the conductive trace and the conductive stub. For example, the conductive pads of the circuit board encompass a relatively large area (e.g., 0.015–0.035 inches in diameter), compared to the area of the conductive trace and conductive stub (e.g., 0.005 inches in width). Because of the difference between the width of the conductive trace and stub and the diameter of the conductive pads, based upon the parameters described above, the impedance of the conventional conductive trace is different than (e.g., larger than) the impedance of the associated conductive pad. For a signal transmitted through the conductive trace and across the conductive pad, such a difference in impedances creates signal reflections in the signal.

In the case where the conductive pad directly contacts the conductive trace and without the use of a conductive stub, an impedance mismatch exists between the conductive pad and the conductive trace. However, when the conductive pad directly contacts the conductive trace without the use of a conductive stub, difference in impedances between the conductive pad and the conductive trace affect a signal transmitted through the conductive trace and across the conductive pad as a function of the frequency of the signal. For example, for signals having frequencies of up to approximately 100 MHz, differences in the impedances between the conductive trace and the conductive pad minimally affect such signals. However, as the frequency of the signal increases, for example a frequency above 10 GHz, differences in the impedances between the conductive trace and the conductive pad increases the attenuation of the signal and degrades the signal quality.

By contrast, embodiments of the present invention significantly overcome the described deficiencies and provide mechanisms for minimizing an impedance mismatch between a signal conductor (e.g., conductive trace) and a contact pad (e.g., conductive pad) on a circuit board to minimize signal reflection of a signal transmitted through the signal conductor and across the contact pad, thereby reducing signal loss. The circuit board has, in a first signal layer, the signal conductor having a relatively small width and the contact pad having a relatively large width. The relatively large width of the contact pad combined with the relatively narrow signal conductor creates an impedance mismatch between the contact pad and the signal conductor. The circuit board has, in a second signal layer, a ground plane separated from the first signal layer by a nonconductive layer. The circuit board defines an opening in the second signal layer underneath the contact pad. The presence of the ground plane underneath the contact pad typically affects the impedance of the contact pad. The opening in the second signal layer removes a portion the ground plane relative to the contact pad and, therefore, reduces the impedance mismatch between the contact pad and the signal conductor to minimize signal reflection of a signal transmitted through the signal conductor and across the contact pad.

In one arrangement, a circuit board has a first signal layer, a second signal layer, and a nonconductive layer disposed between the first signal layer and the second signal layer. The first signal layer has a signal conductor and a contact pad in electrical communication with the signal conductor. The second signal layer orients substantially parallel to the first signal layer and has a conductive plane defining an opening, the opening substantially aligned with the contact pad. The opening in the second signal layer reduces a mismatch of impedances between the contact pad and the signal conductor, thereby minimizing signal reflection of a signal transmitted through the signal conductor and across the contact pad and reducing signal loss caused by such reflection.

In one arrangement, the contact pad has a pad center axis and the opening, defined by the conductive plane, has an opening center axis. The pad center axis orients substantially perpendicular to the first signal layer, the opening center axis orients substantially perpendicular to the second signal layer, and the pad center axis and the opening center axis are collinear. Such a collinear arrangement of the pad center axis and the opening center axis centers the opening relative to the contact pad such that the opening adjusts the impedance of the contact pad and minimally affects the impedance of the signal conductor associated with the contact pad.

In one arrangement, the contact pad has a pad center axis and the opening, defined by the conductive plane, has an opening center axis. The pad center axis orients substantially perpendicular to the first signal layer and the opening center axis orients substantially perpendicular to the second signal layer. The pad center axis and the opening center axis orient substantially parallel to each other and define an offset distance between the pad center axis and the opening center axis. The offset distance allows a portion of the second conductive layer and a portion of the opening to align with the contact pad. Such alignment allows both the opening and the second signal layer to adjust the impedance of the contact pad relative to the signal conductor.

The features of the invention, as described above, may be employed in systems, devices, and methods for minimizing an impedance mismatch between a signal conductor and a contact pad in a circuit board, as well as in other computer-related components such as those of Cisco Systems of San Jose, Calif.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention provide mechanisms for minimizing an impedance mismatch between a signal conductor (e.g., conductive trace) and a contact pad (e.g., conductive pad) on a circuit board to minimize signal reflection of a signal transmitted through the signal conductor and across the contact pad, thereby reducing signal loss. The circuit board has, in a first signal layer, the signal conductor having a relatively small width and the contact pad having a relatively large width. The relatively large width of the contact pad combined with the relatively narrow signal conductor creates an impedance mismatch between the contact pad and the signal conductor. The circuit board has, in a second signal layer, a ground plane separated from the first signal layer by a nonconductive layer. The circuit board defines an opening in the second signal layer underneath the contact pad. The presence of the ground plane underneath the contact pad typically affects the impedance of the contact pad. The opening in the second signal layer removes a portion the ground plane relative to the contact pad and, therefore, reduces the impedance mismatch between the contact pad and the signal conductor to minimize signal reflection of a signal transmitted through the signal conductor and across the contact pad and maintains integrity of the signal.

Figure 1:
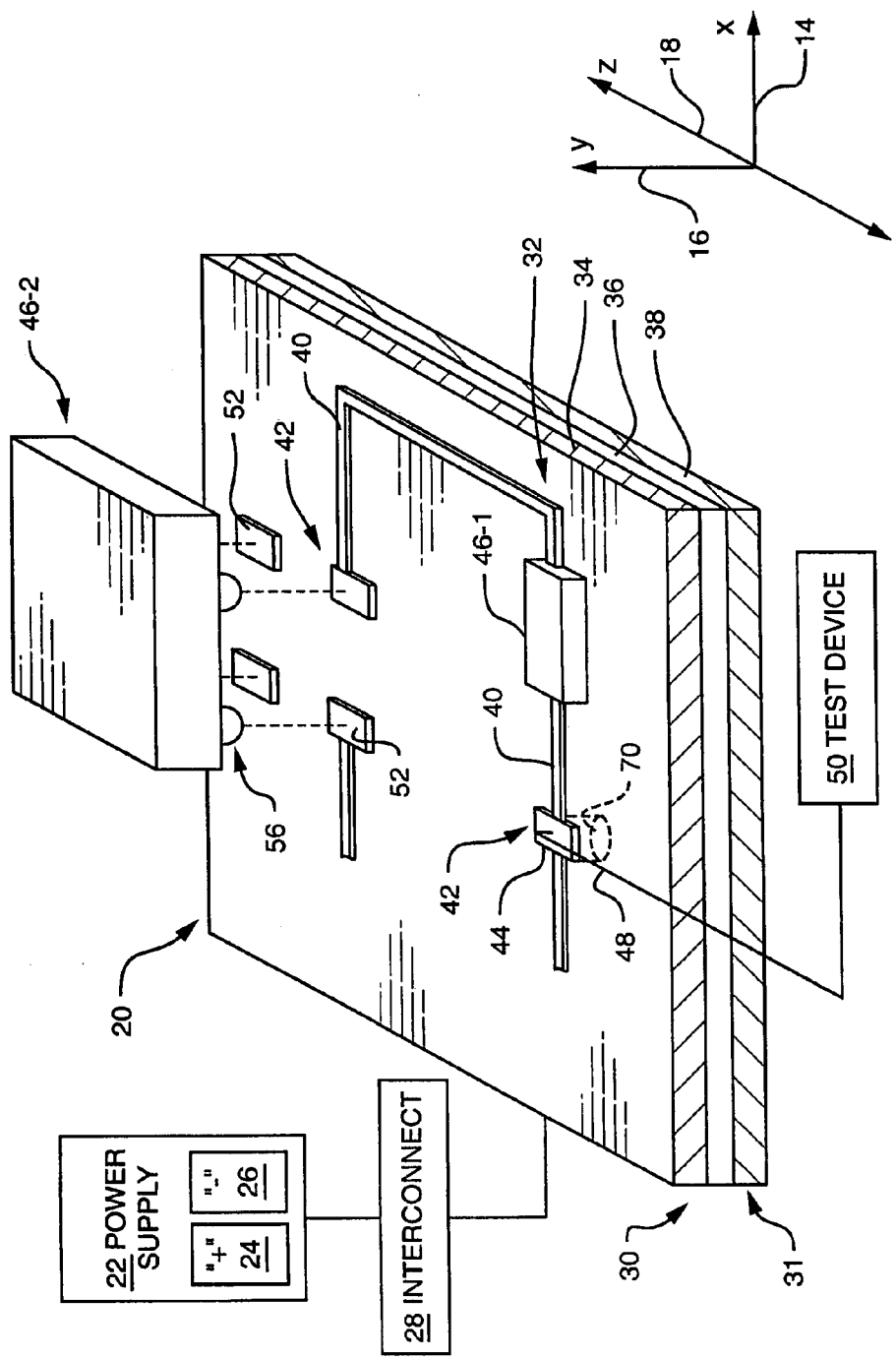
FIG. 1 is a view of an electronic system having a circuit board that is suitable for use by the invention.

FIG. 1 shows an electronic system 20 that is suitable for use by the invention. The electronic system 20 includes a power supply 22, an interconnect 28 and a circuit board 30. The power supply 22 has a voltage terminal 24 and a ground terminal 26. The interconnect 24 (e.g., such as a connector assembly or a back plane) places the circuit board 30 in electrical communication with the power supply 22 to enable the power supply 22 to provide power to the circuit board 26. For example, the interconnect 28 electrically couples the voltage terminal 24 of the power supply 22 with a power plane of the circuit board 30 such that the power plane carries a power supply voltage signal within the circuit board 30. Furthermore, the interconnect 28 electrically couples the ground terminal 26 with a ground plane of the circuit board 30 such that the ground plane carries a power supply ground signal (e.g., a reference voltage such as zero volts or chassis ground) within the circuit board 30.

The circuit board 30, as illustrated in FIG. 1, includes multiple circuit board layers 31 that form the circuit board 30. The layers 31 include a first signal layer 32, a nonconductive layer 34, and a second signal layer 36.

As shown in FIG. 1, the first signal layer 32 includes signal conductors 40 (e.g., outer-layer surface traces) and contact pads 42. The first signal layer 32 is formed of an electrically conductive material, such as a copper material, and carries data signals to circuit board components 46 associated with the circuit board. The signal conductors 40 electrically connect the circuit board components 46-1, 46-2 of the circuit board 30. The signal conductors 40 also electrically communicate with the contact pads 42 of the circuit board 30.

In one arrangement, the contact pads 42 are configured to operate as test pads 44. For example, circuit board manufacturers conventionally test the continuity and operability of a circuit board 30 during the manufacturing process and prior to shipping of the circuit board 30 to end users. The test pads 44 provide locations on the circuit board 30 that allow the manufacturers to connect a circuit board testing device 50 to the circuit board 30, via a connector or probe 48, and detect the integrity or operability of the circuit board 30.

In one arrangement, the contact pads 42, are configured to operate as circuit board component connection pads 52. For example, circuit board component 46-2 is a Surface Mount Technology (SMT) device having a solder ball array 56. The circuit board component connection pads 52 form an electrically conductive interface between the circuit board 30 and the circuit board component 46-2 (e.g., a ball grid array (BGA) device,) via the solder ball array 56. The circuit board component connection pads 52 carry both data signals and power signals between the circuit board 30 and the circuit board component 46-2.

The nonconductive layer 34 is located between the first signal layer 32 and the second signal layer 36. The nonconductive layer 34 is formed of an electrically nonconductive (e.g., dielectric) material, such as a fiberglass material (e.g., FR4). In one arrangement, the circuit board 30 further includes an additional nonconductive layer 38 to separate the second signal layer 36 from an additional signal layer (not shown) associated with the circuit board 30. For example, the additional signal layer includes an imbedded signal layer (e.g., a signal layer embedded within the nonconductive layer 38) or a surface signal layer coupled to the nonconductive layer 38.

The second signal layer 36 is formed of an electrically conductive material, such as a copper material. The second signal layer 36 forms a conductive plane 86 (e.g., a substantially continuous plane of copper material) parallel to the first signal layer 32. The second signal layer 36 attaches, via the interconnect 28, to the power supply 22 and carries either a power supply voltage signal or a power supply ground signal within the circuit board 30. In one arrangement, the second signal layer 36 carries the power supply ground signal and forms the ground plane or ground layer for the circuit board 30.

FIG. 1 also illustrates an opening 70 defined by the second signal layer 36. The opening 70 adjusts the impedance of the contact pad 42, as described with respect to FIG. 2.

Figure 2:
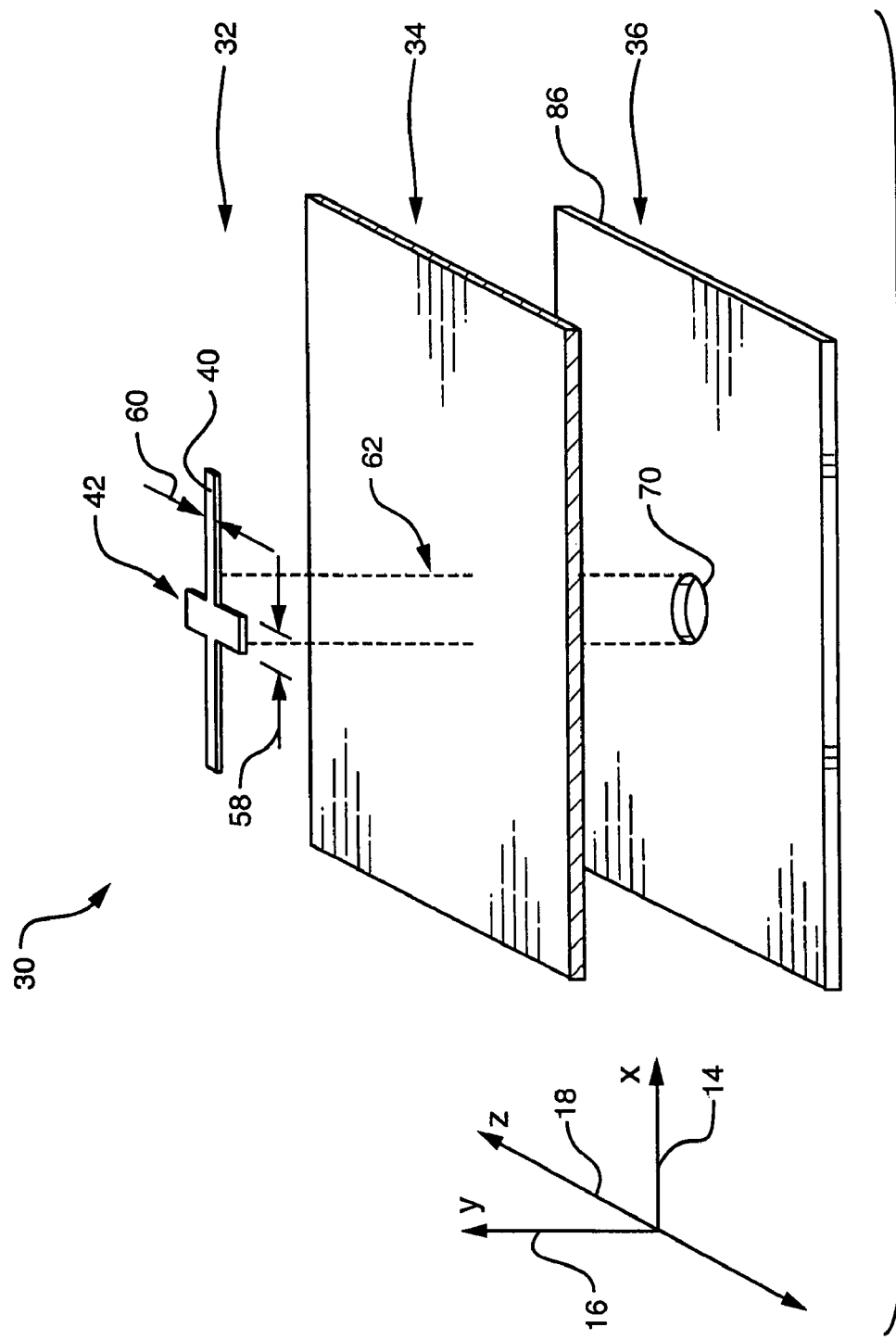
FIG. 2 is an exploded view of the layers of the circuit board of FIG. 1.

FIG. 2 illustrates an exploded view of the first signal layer 32, nonconductive layer 34, and the second signal layer 36 of the circuit board 30. As shown, the second signal layer 36 defines the opening 70 substantially aligned 62 with the contact pad 42 of the first signal layer 32 such that the location of the opening 70 on the second signal layer 36 mirrors the location of the contact pad 42 of the first signal layer 32.

As indicated above, several characteristics of the circuit board 30 conventionally affect the impedance of the contact pad 42 and the signal conductor 40 on the circuit board 30. For example, a width 58 of the contact pad 42 affects the impedance of the contact pad 42 while a width 60 of the signal conductor 40 affects the impedance of the signal conductor 40. In one arrangement, the pad width 58 of the contact pad 42 is between approximately 0.015 and 0.035 inches and the signal conductor width 60 of the signal conductor 40 is approximately 0.005 inches. Because the pad width 58 (e.g., pad diameter) of the contact pads 42 is substantially larger than the signal conductor width 60 of the signal conductor 40, the relative impedances of the contact pad 42 and the signal conductor 40 are different (e.g., the impedance of the contact pad 42 is less than the impedance of the signal conductor width 60).

The proximity of the contact pad 42 and the signal conductor 40 to the second signal layer 36 also affects the impedance of the contact pad 42 and, the signal conductor 40. Embodiments of the invention relate to techniques for adjusting the impedance mismatch between the contact pad 42 and the signal conductor 40 by adjusting the geometric configuration of the second signal layer.

As shown in FIG. 2, placement of the opening 70 in the second signal layer 36 relative to the contact pad 42 of the first signal layer 32 removes a portion of the second signal layer 36 relative to the contact pad 42. Such a configuration of the circuit board 30 adjusts the impedance of the contact pad 42 to substantially match the impedance of the signal conductor 40.

For example, the second signal layer 36 creates a capacitive coupling with the contact pad 42 that reduces the impedance of both the contact pad 42 relative to the signal conductor 40. The opening 70 reduces the capacitive coupling between the contact pad 42 and the second signal layer 36 and increases the impedance of the contact pad 42 to substantially match the impedance of the signal conductor 40 in communication with the contact pad 42. The opening 70 in the second signal layer 36, therefore, minimizes signal reflection of a signal transmitted through the signal conductor 40 and across the contact pad 42 and reduces signal loss caused by such reflection.

Figure 3:
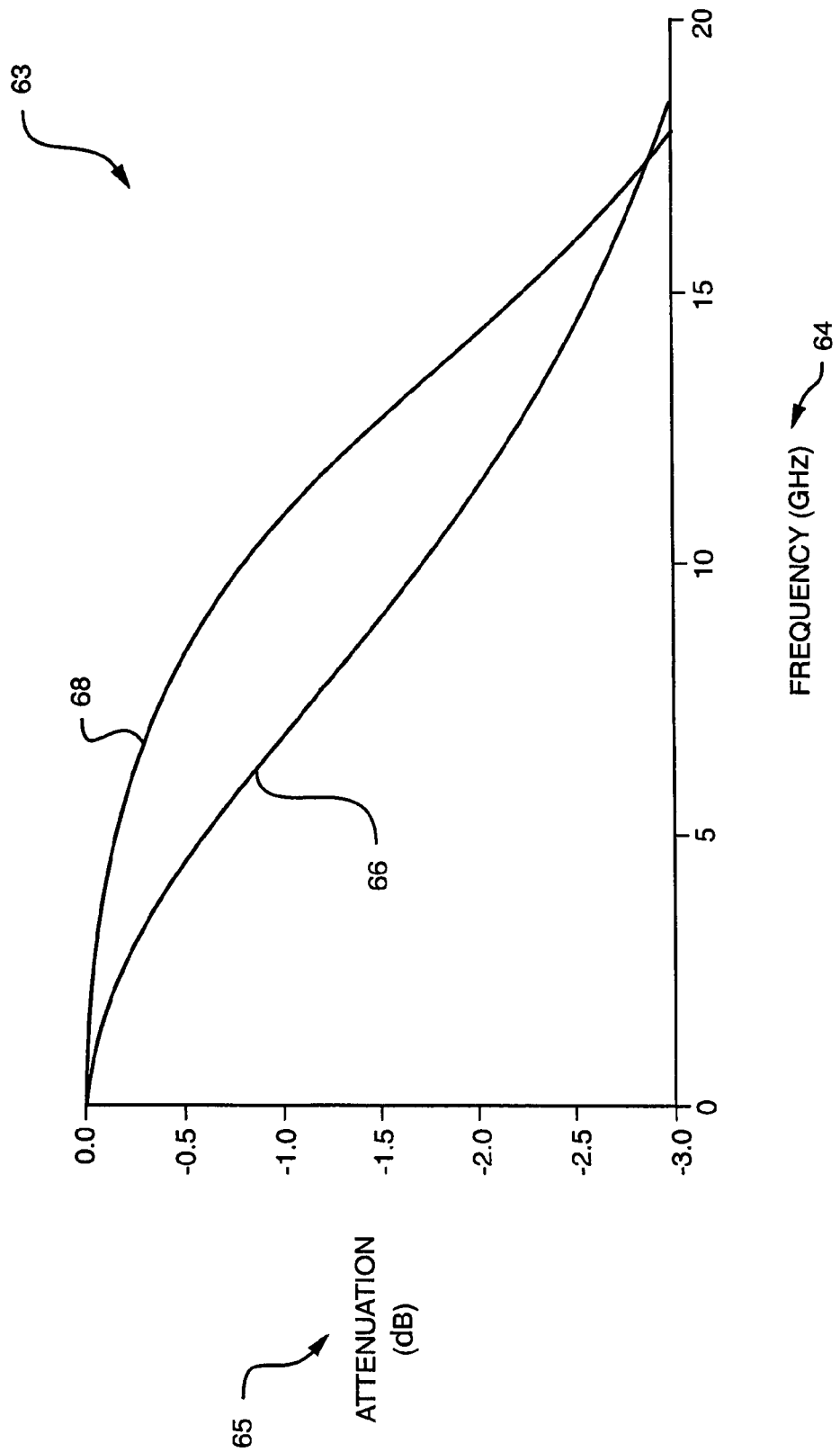
FIG. 3 is a graph illustrating the frequency responses of a contact pad of the circuit board of FIG. 1 according to one embodiment of the invention.

FIG. 3 is a graph 63 that illustrates the affect of the opening 70 on signal response for a signal carried by the contact pad 42 and the signal conductor 40.

The graph 63 shows a first curve 66 and a second curve 68. The first curve 66 represents the signal response, or attenuation, of a signal transmitted through a signal conductor and across a contact pad of a conventional circuit board. The second curve 68 represents the signal response, or attenuation, of a signal transmitted through a signal conductor 40 and across a contact pad 42 where the circuit board 30 has a second signal layer 36 defining an opening 70 substantially aligned 62 with the contact pad 42. In a comparison of the first curve 66 and the second curve 68, as the frequency of the signal increase from 0 GHz to approximately 20 GHz (Gigabit/sec), the increase in attenuation 65 of the first curve 66 is greater than the increase in the attenuation 65 of the second curve. The presence of the opening 70 relative to the contact pad 42, therefore, decreases the amount of signal loss for a signal transmitted through the signal conductor 40 and across an associated contact pad 42, compared to a signal transmitted through a signal conductor and across a contact pad of a conventional circuit board.

Figure 4:
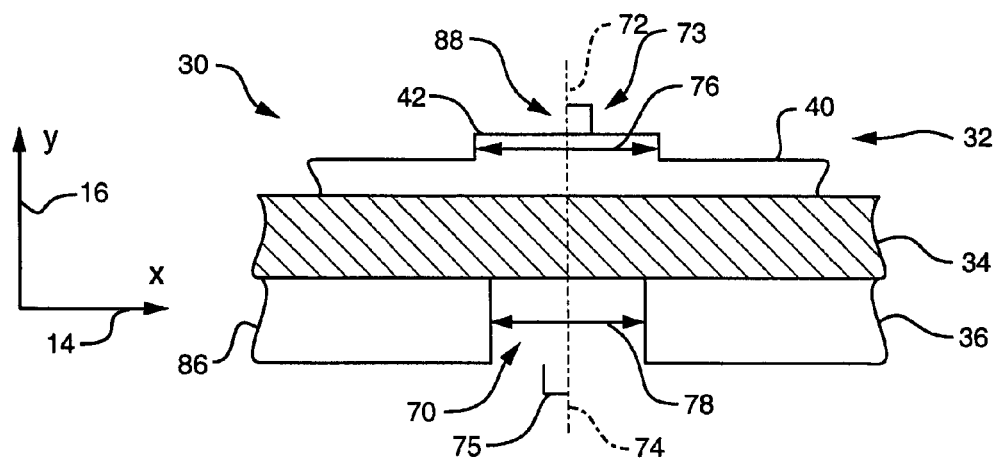
FIG. 4 is a side sectional view of the circuit board of FIG. 1, according to one embodiment of the invention.

FIG. 4 illustrates a side sectional view of an arrangement of the contact pad 42 and opening 70 of the circuit board 30. The contact pad 42 has a pad center axis 72 that is substantially perpendicular 73 to the first signal layer 32 of the circuit board 30. The opening 70, as defined by the conductive plane 86, has an opening center axis 74 that is substantially perpendicular 75 to the second signal layer 36 of the circuit board 30. The pad center axis 72 and the opening center axis 74 are collinear 88, relative to the x-axis 14 and z-axis 18. Such a collinear 88 arrangement of the pad center axis 72 and the opening center axis 74 centers the opening 70 relative to the contact pad 42 such that the opening 70 adjusts the impedance of the contact pad 42 and minimally affects the impedance of the signal conductor 40 associated with the contact pad 42 (e.g., the area of the opening 70 of the second signal layer 36 minimally aligns or overlaps with the area of the signal conductor 40 on the first signal layer 32).

The contact pad 42 has a pad diameter 76 and the opening 70, defined by the conductive plane 36, has an opening diameter 78. The opening diameter 78 of the opening 70 affects the impedance of the contact pad 42. For example, in the case where the pad center axis 72 and the opening center axis 74 are collinear 88, the opening diameter 78 is configured as smaller than the contact pad diameter 76. In one arrangement, a manufacturer adjusts an opening diameter 78 of the opening 70 based upon results from an electromagnetic simulator. For example, in the case where the contact pad diameter 42 is approximately 0.035 inches, the electromagnetic simulator produces the optimum diameter 78 of the opening 70 as approximately 0.030 inches. The manufacturer adjusts the diameter 78 of the opening 70 based upon results from an electromagnetic simulator to effectively "tune" the impedance of the contact pad 42 to substantially match the impedance of the signal conductor 40 associated with (e.g., in electrical communication with) the contact pad 42.

As indicated above, the collinear arrangement of the pad center axis 72 and the opening center axis 74 allows the opening 70 to adjust the impedance of the contact pad 42 while minimally affecting the impedance of the signal conductor 40 associated with the contact pad 42. The location of the opening 70 within the second signal layer 36 and relative to the first signal layer 32 can potentially affect the impedances of other signal conductors or traces routed in the vicinity of the signal conductor 40 associated with the contact pad 42. In one arrangement, a manufacturer locates the collinearly aligned pad center axis 72 and opening center axis 74 relative to the signal conductor 40 to minimize the affect of the opening 70 on the impedances of additional signal conductors located in the vicinity of the signal conductor 40.

Figure 5:
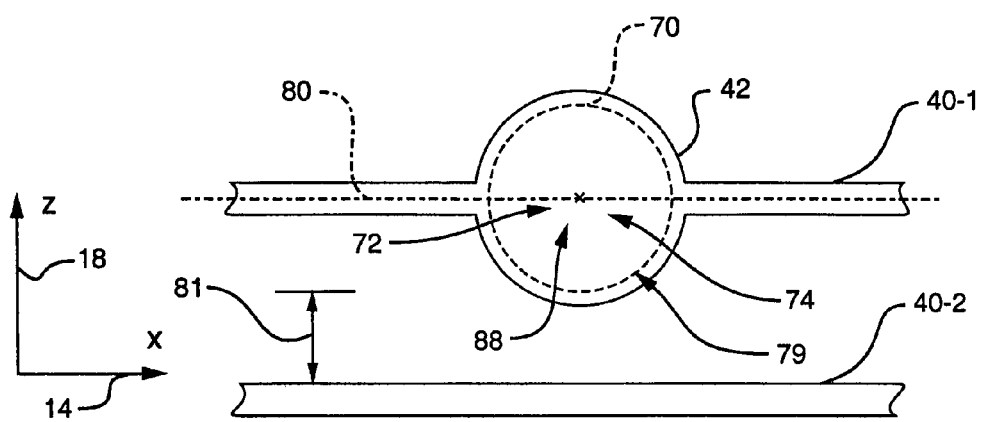
FIG. 5 is a top view of a contact pad and a signal conductor of the circuit board of FIG. 1, according to one embodiment of the invention.

FIG. 5 illustrates a top view of an arrangement of the circuit board 30 of FIG. 4. The circuit board 30 has, located in the first signal layer 32, the contact pad 42 in electrical communication with a first signal conductor 40-1 and has the opening 70 located in the second signal layer 36. As shown, the first signal conductor 40-1 has a centerline or center axis 80. The pad center axis 72 and the opening center axis 72 have collinear axes 72, 74 that substantially intersect the centerline 80 of the first signal conductor 40-1.

Substantial intersection of the collinear axes 72, 74 and the centerline 80 of the first signal conductor 40-1 limits the affect of the opening 70 on the impedance of a second signal conductor 40-2 located in relative proximity to the first signal conductor 40-1. For example, alignment of the collinear axes 72, 74 and the centerline 80 of the first signal conductor 40-1 creates spacing or distance 81 along a z-axis direction 18 between a diameter edge 79 of the opening 70 and the second signal conductor 40-2 located in the routed in the vicinity of the first signal conductor 40-1. As described above, the opening 70 adjusts the impedance of the contact pad 42 relative to the first signal conductor 40-1. In the arrangement shown in FIG. 5, the spacing 81 between the opening 70 and the second signal conductor 40-2 prevents the opening 70 from "overlapping" the second signal conductor 40-2 and, therefore, adjusting the impedance of the second signal conductor 40-2. In the configuration of the contact pad 42, opening 70, the first signal carrier 40-1, and the second signal carrier 40-2, shown in FIG. 5, a manufacturer can form the opening 70 within the second signal layer 36 to adjust the impedance of the contact pad 42 without rerouting the second signal conductor 40-2 at a distance away from the opening 70 or otherwise change the layout of the circuit board 30.

Figure 6:
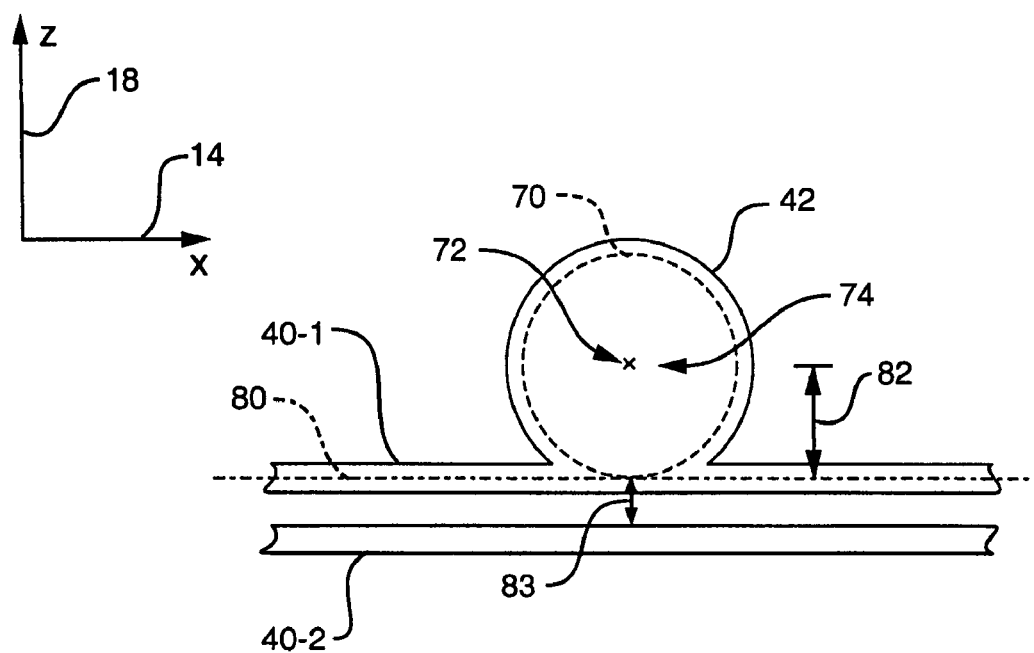
FIG. 6 is a top view of a contact pad and a signal conductor of the circuit board of FIG. 1, according to one embodiment of the invention.

FIG. 6 illustrates a top view of an alternate arrangement of the circuit board 30 of FIG. 5. The arrangement is similar to the arrangement in FIG. 5 in that the first signal conductor 40-1 has a centerline 80 and the pad center axis 72 and the opening center axis 72 have collinear axes 72, 74. However, as illustrated, the collinear axes 72, 74 that define an offset distance 82 relative to the centerline 80 of the first signal conductor 40-1.

Substantial intersection of the collinear axes 72, 74 and the offset distance 82 relative to the centerline 80 of the first signal conductor 40-1 limits the affect of the opening 70 on the impedance of a second signal conductor 40-2 located in relatively close proximity to the first signal conductor 40-1. For example, assume the first signal conductor 40-1 and the second signal conductor 40-2 form part of a signal bus where each conductor 40-1, 40-2 are in relatively close geographic proximity. The offset distance 82 between the centerline 80 of the first signal conductor 40-1 and the collinear axes 72, 74 of the contact pad 42 and the opening 70 creates a spacing 83 along a z-axis direction 18 between a diameter edge 79 of the opening 70 and the second signal conductor 40-2. As shown in FIG. 6, the spacing 83 between the opening 70 and the second signal conductor 40-2 prevents the opening 70 from "overlapping" the second signal conductor 40-2 and, therefore, adjusting the impedance of the second signal conductor 40-2. In the configuration of the contact pad 42, opening 70, the first signal carrier 40-1, and the second signal carrier 40-2, shown in FIG. 6, a manufacturer can form the opening 70 within the second signal layer 36 to adjust the impedance of the contact pad 42 without rerouting the second signal conductor 40-2 at a distance away from the opening 70 or otherwise change the layout of the circuit board 30.

Figure 7:
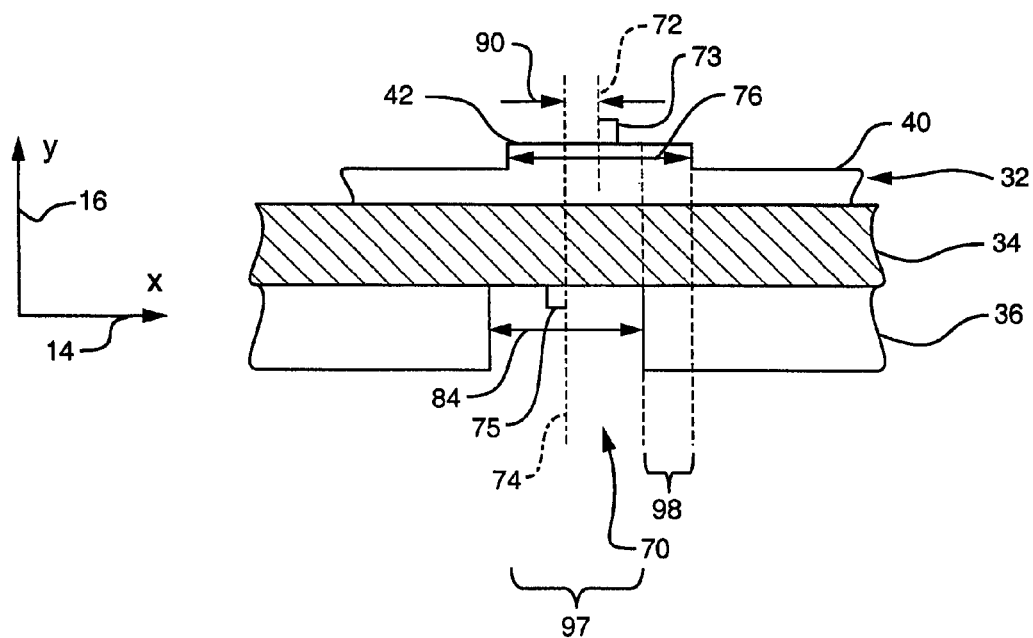
FIG. 7 is a side sectional view of the circuit board of FIG. 1, according to one embodiment of the invention.

FIG. 7 shows a side sectional view of another arrangement of the contact pad 42 and opening 70 of the circuit board 30. The contact pad 42 has a pad center axis 72 that is substantially perpendicular 73 to the first signal layer 32.

The opening 70, as defined by the conductive plane 86, has an opening center axis 74 that is substantially perpendicular 75 to the second signal layer 36. The pad center axis 72 and the opening center axis 74 are oriented in a substantially parallel manner and define an offset distance 90 between the pad center axis 72 and the opening center axis 74. For example, pad center axis 72 and the opening center axis 74 define the offset distance 90 along an x-axis direction 14 relative to the circuit board 30. The offset distance 90 provides alignment of a portion 97 of the opening 70 with the contact pad 42 and provides alignment of a portion 98 of the second conductive layer 36 with the contact pad 42. Such alignment allows a combination of both the portion 97 of the opening 70 and the portion 98 of the second signal layer 36 to influence or adjust the impedance of the contact pad 42. The affect of the opening 70 and the portion 98 of the second signal layer 36 on the impedance of the contact pad 42 is illustrated with respect to FIG. 8 and described below.

The offset distance 90 between the pad center axis 72 and the opening center axis 74 aligns the portion 97 of the opening 70 with the contact pad 42 and aligns the portion 98 of the second conductive layer 36 with the contact pad 42. Alignment of the portion 98 of the second conductive layer 36 with the contact pad 42 (e.g., along the y-axis direction 16) is illustrated as shaded area 99. During operation of the circuit board 30, for example, as current 102 travels through the signal conductor 40 and reaches the contact pad 42, the current 102 travels through the portion of the contact pad 42 within the shaded area 99 (e.g., the portion of the contact pad 42 aligned with, along the y-axis 16, the portion 98 of the second signal layer 36). Orientation of the portion 97 of the opening 70 and the portion 98 of the second signal layer 36 relative to the contact pad 42 effectively reduces the width 58 (e.g., area) of the contact pad 42 relative to the width 60 of the signal conductor 40. Such reduction of the width 58 of the contact pad 42, as shown in FIG. 8, adjusts (e.g., raises) the impedance of the contact pad 42 relative to the impedance of the signal conductor 40, thereby decreasing the amount of signal reflection and signal loss for a signal transmitted through the signal conductor 40 and across the contact pad 42 during operation of the circuit board 30.

Returning to FIG. 7, in one arrangement, the contact pad 42 has the pad diameter 76 and the opening 70 defined by the conductive plane 36 has an opening diameter 84 where the opening diameter 84 is at least equal to the contact pad diameter 76. For example, the opening diameter 84 of the opening 70 is larger than the contact pad diameter 76 of the contact pad 42. In one arrangement, the relatively larger opening diameter 84 ensures that a portion 97 of the opening 70 in the second signal layer 36 aligns with a portion of the contact pad 42 of the first signal layer 32 during the circuit board manufacturing process, thereby causing the opening 70 to adjust the impedance of the contact pad 42.

Figure 8:
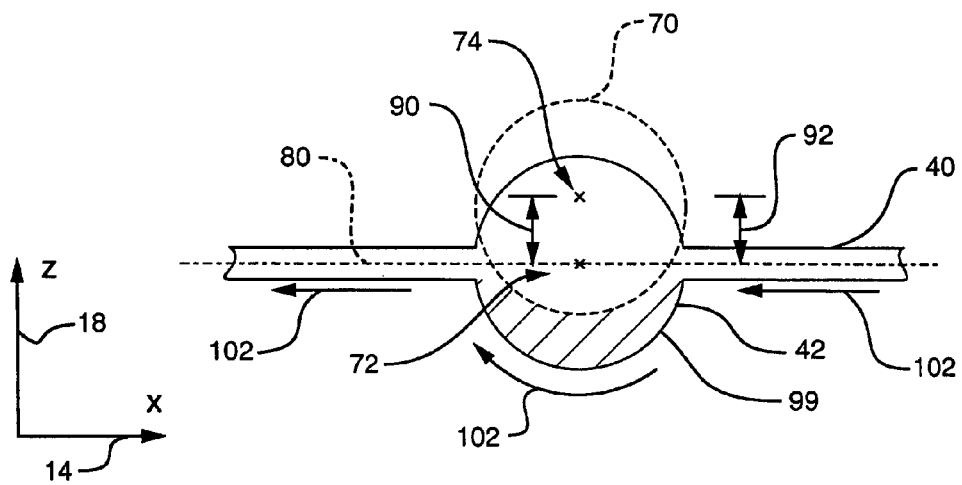
FIG. 8 is a top view of a contact pad and a signal conductor of the circuit board of FIG. 1, according to one embodiment of the invention.

FIG. 8 illustrates an arrangement of the contact pad 42, signal conductor 40, and the opening 70 of FIG. 7. The signal conductor 40 has a centerline 80. The pad center axis 72 of the contact pad 42 substantially intersects the centerline 80 of the signal conductor 40. The opening center axis 74 defines an offset 92 relative to the centerline 80 of the signal conductor 40 such that the offset 92 between the opening center axis 74 and the centerline 80 is equal to the offset 90 between the opening center axis 74 and the pad center axis 72. A manufacturer utilizes the configuration of the contact pad 42, signal conductor 40, and the opening 70 of FIG. 8 based upon the geometric constraints of a layout of the circuit board 30.

For example, assume the circuit board 30 includes additional signal conductors or circuit board components located on either side of the signal conductor 40 (e.g., along the z-axis direction 18). The manufacturer offsets 92 the opening 70 relative to the pad center axis 72 of the contact pad 42 and the centerline 80 of the signal conductor 40 to minimize the opening 70 from "overlapping" the additional signal conductors or circuit board components and, therefore, adjusting the impedance of the second signal conductor additional signal conductors or circuit board components. In the configuration of the contact pad 42, opening 70, the first signal carrier 40-1, and the second signal carrier 40-2, shown in FIG. 8, a manufacturer forms the opening 70 based upon the geometric constraints of the circuit board 30 layout.

Figure 9:
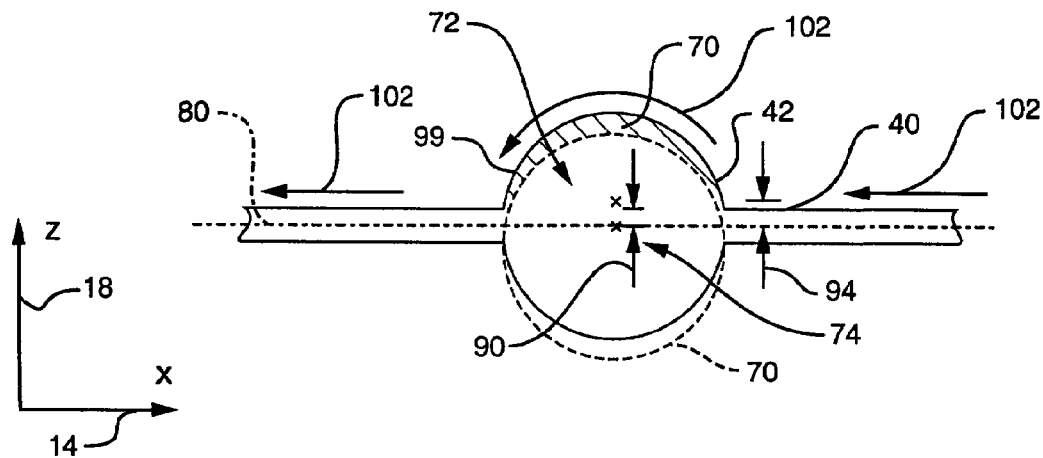
FIG. 9 is a top view of a contact pad and a signal conductor of the circuit board of FIG. 1, according to one embodiment of the invention.

FIG. 9 illustrates another arrangement of the contact pad 42, signal conductor 40, and the opening 70 of FIG. 7. The arrangement is similar to the arrangement in FIG. 8 in that the first signal conductor 40-1 has a centerline 80. However, as illustrated, the opening center axis 74 of the opening 70 substantially intersects the centerline 80 of the signal conductor 40. The contact pad axis 72 defines an offset 94 relative to the centerline 80 of the signal conductor 40 such that the offset 92 between the contact pad axis 72 and the centerline 80 is equal to the offset 9Q between the contact pad axis 72 and the opening center axis 74. A manufacturer utilizes the configuration of the contact pad 42, the signal conductor 40, and the opening 7Q of FIG. 9 based upon the geometric constraints the circuit board 30 layout.

For example, assume the circuit board 30 includes additional signal conductors or circuit board components located on either side of the signal conductor 40 (e.g., along the z-axis direction 18). The manufacturer offsets 92 the contact pad 42 relative to the opening center axis 74 of the opening 70 and relative to the centerline 80 of the signal conductor 40 to minimize the relative proximity of the contact pad 42 with respect to the additional signal conductors or circuit board components (e.g., maximize the space between the contact pad 42 and the adjacent signal conductors or circuit board components). Such positioning of the contact pad 42, therefore, minimizes the contact pad 42 from creating a potential short circuit with the adjacent signal conductors or circuit board components.

Figure 10:
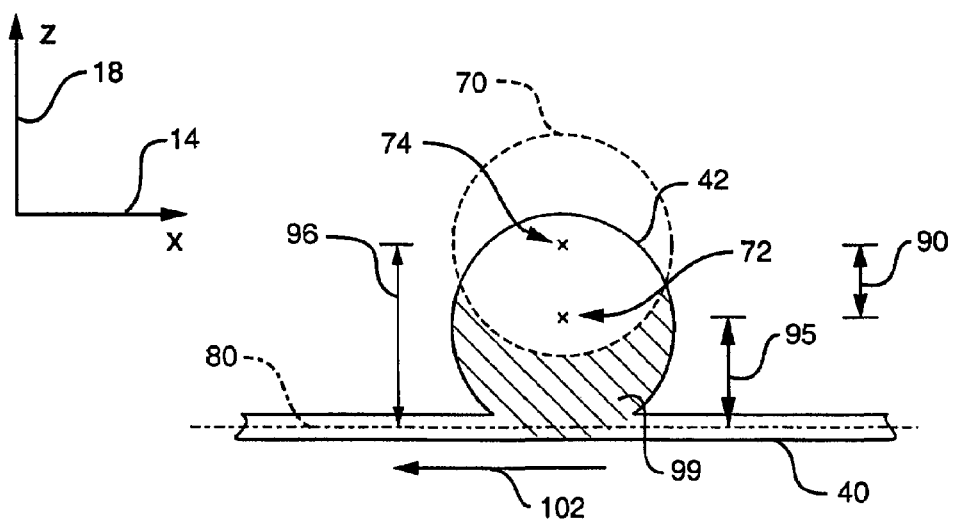
FIG. 10 is a top view of a contact pad and a signal conductor of the circuit board of FIG. 1, according to one embodiment of the invention.

FIG. 10 illustrates another arrangement of the contact pad 42, signal conductor 40, and the opening 70 of FIG. 7. The arrangement is similar to the arrangement in FIG. 8 in that the first signal conductor 40-1 has a centerline 80. However, as illustrated, the contact pad axis 72 defines a first centerline offset 95 relative to the centerline 80 of the signal conductor 40. The opening center axis 74 defines a second centerline offset 96 relative to the centerline 80 of the signal conductor 40 where the first centerline offset 95 is not equal to the second centerline offset 96. A manufacturer utilizes the configuration of the contact pad 42, the signal conductor 40, and the opening 70 of FIG. 10 based upon the geometric constraints the circuit board 30 layout.

For example, assume the circuit board 30 includes additional signal conductors or circuit board components located on either side of the signal conductor 40 (e.g., along the z-axis direction 18). The manufacturer offsets 95 the contact pad 42 relative to the centerline 80 of the signal conductor 40 to minimize the relative proximity of the contact pad 42 with respect to the additional signal conductors or circuit board components and, therefore, limit the contact pad 42 from creating a potential short circuit with the adjacent signal conductors or circuit board components. The manufacturer also offsets 96 the opening center axis 74 of the opening 70 relative to the centerline 80 of the signal conductor 40 to minimize the opening 70 from "overlapping" the additional signal conductors or circuit board components located on either side of the signal conductor 40.

Figure 11:
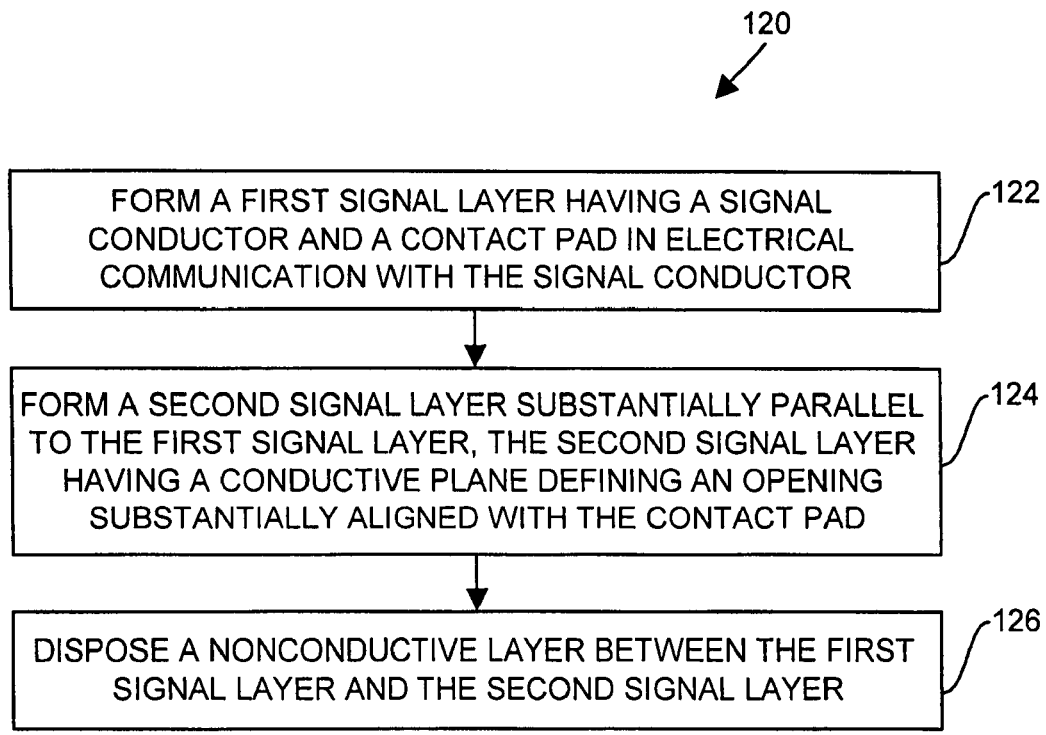
FIG. 11 is a flow chart showing a method for assembling a circuit board assembly, according to one embodiment of the invention.

FIG. 11 illustrates a method 120 for assembling a circuit board 30, according to one embodiment of the invention. Such a method can be performed either manually (e.g., by a technician on an assembly line) or automatically (e.g., by automated equipment).

In step 122, an assembler forms a first signal layer 32 having a signal conductor 40 and a contact pad 42 in electrical communication with the signal conductor 40. In one arrangement, the first signal layer 32 is configured to carry data signals associated with the circuit board 30.

In step 124, the assembler forms a second signal layer 34 substantially parallel to the first signal layer 32 where the second signal layer 34 has a conductive plane 86 defining an opening 70 substantially aligned 62 with the contact pad 42. In one arrangement, the second signal layer 36 is configured to carry power signals, such as a ground signal, associated with the circuit board 30.

In step 126, the assembler disposes a nonconductive layer 34 between the first signal layer 32 and the second signal layer 36. The nonconductive layer electrically separates the first signal layer 32 from the second signal layer 36. Alignment of the opening 70 of the second signal layer 36 with the contact pad 42 of the first signal layer 32, along with the presence of the nonconductive layer 34 between the first signal layer 32 and the second signal layer 36, allows the opening 70 to adjust the impedance of the contact pad 42 such that the impedance of the contact pad 42 is substantially equal to the impedance of the signal conductor 40.

While this invention has been particularly shown and described with references to preferred embodiments thereof, it will be understood by those skilled in the art that various changes in form and details may be made therein without departing from the spirit and scope of the invention as defined by the appended claims.

As described above, and as illustrated in FIG. 1, the circuit board 30 has a conductive first signal layer 32, a nonconductive layer 34, and a conductive second signal layer 36 sandwiched together to form the circuit board 30. Such an arrangement is by way of example only. In one arrangement, the circuit board 30 has additional interleaved conductive layers and nonconductive layers formed below the conductive first signal layer 32, nonconductive layer 34, and conductive second signal layer 36.

As described above, and as illustrated in FIG. 2, the opening 70 in the second signal layer 36 is circular in shape. Such illustration is by way of example only. In another arrangement a manufacturer forms the opening 70 within the second signal layer 36 in any geometry necessary to adjust the impedance of an associated contact pad 42 to match the impedance of the signal conductor 40.

As described above, in a method for assembling a circuit board 30, an assembler forms a first signal layer 32 having a signal conductor 40 and a contact pad 42 in electrical communication with the signal conductor 40, forms a second signal layer 34 substantially parallel to the first signal layer 32 where the second signal layer 34 has a conductive plane 86 defining an opening 70 substantially aligned 62 with the contact pad 42, and disposes a nonconductive layer 34 between the first signal layer 32 and the second signal layer 36. Such an arrangement is by way of example only. In another arrangement, a manufacturer utilizes a dielectric board having planar copper sheets located on opposing surfaces of the dielectric board. The manufacturer etches copper from a copper sheet located on a first surface of the dielectric board to form signal conductors 40 and contact pads 42. The manufacturer etches copper a copper sheet located on a second surface of the dielectric board to form openings 70 in the second surface, the opening 70 substantially aligned 62 with the contact pad 42 etched in the copper sheet of the first surface of the dielectric board.

Such variations are intended to be covered by the scope of this invention. As such, the foregoing description of embodiments of the invention is not intended to be limiting. Rather, any limitations to the invention are presented in the following claims.

What is claimed is:

1. A circuit board comprising:
   a first signal layer having a signal conductor and a contact pad in electrical communication with the signal conductor;
   a second signal layer substantially parallel to the first signal layer, the second signal layer having a conductive plane defining an opening, the opening substantially aligned with the contact pad, and the opening configured to minimize a signal reflection of a signal transmitted through the signal conductor and across the contact pad; and
   a nonconductive layer disposed between the first signal layer and the second signal layer;
   wherein the contact pad comprises a pad center axis and wherein the opening, defined by the conductive plane, comprises an opening center axis, the pad center axis substantially perpendicular to the first signal layer, the opening center axis substantially perpendicular to the second signal layer, and the pad center axis and the opening center axis oriented substantially parallel and defining an offset distance between the pad center axis and the opening center axis; and
   wherein the opening defined by the conductive plane comprises an opening diameter and wherein the contact pad comprises a pad diameter, the opening diameter being at least equal to the contact pad diameter.

2. The circuit board of claim 1 wherein the signal conductor comprises a centerline and wherein the pad center axis of the contact pad substantially intersects the centerline of the signal conductor.

3. The circuit board of claim 1 wherein the signal conductor comprises a centerline and wherein the opening center axis of the opening defined by the conductive plane substantially intersects the centerline of the signal conductor.

4. The circuit board of claim 1 wherein the signal conductor comprises a centerline, the pad center axis of the contact pad defines a first centerline offset relative to the centerline of the signal conductor, and the opening center axis of the opening defined by the conductive plane defines a second centerline offset relative to the centerline of the signal conductor.

5. The circuit board of claim 1 wherein the contact pad comprises a testing pad that allows attachment of a circuit board testing device to the circuit board.

6. The circuit board of claim 1 wherein the contact pad comprises a circuit board component connection pad that allows attachment of a circuit board component to the circuit board.

7. The circuit board of claim 1, wherein:
   the opening defined by the conductive plane extends from a first face of the second signal layer facing the nonconductive layer to a second face of the second signal layer, the second face of the second signal layer opposing the first face of the first signal layer; and the nonconductive layer being disposed across the first face of the second signal layer such that the nonconductive layer covers the opening defined by the conductive plane.

8. An electronic system comprising:
a power supply having a voltage terminal and a ground terminal;
an interconnect in electrical communication with the voltage terminal and the ground terminal of the power supply; and
a circuit board having:
a first signal layer having a signal conductor and a contact pad in electrical communication with the signal conductor,
a second signal layer substantially parallel to the first signal layer, the second signal layer having a conductive plane defining an opening, the conductive plane in electrical communication with one of the voltage terminal and the ground terminal of the power supply through the interconnect, the opening substantially aligned with the contact pad, and the opening configured to minimize a signal reflection of a signal transmitted through the signal conductor and across the contact pad, and
a nonconductive layer disposed between the first signal layer and the second signal layer;
wherein the contact pad comprises a pad center axis and wherein the opening, defined by the conductive plane, comprises an opening center axis, the pad center axis substantially perpendicular to the first signal layer, the opening center axis substantially perpendicular to the second signal layer, and the pad center axis and the opening center axis oriented substantially parallel and defining an offset distance between the pad center axis and the opening center axis;
wherein the opening defined by the conductive plane comprises an opening diameter and wherein the contact pad comprises a pad diameter, the opening diameter being at least equal to the contact pad diameter.

9. The electronic system of claim 8 wherein the signal conductor comprises a centerline and wherein the pad center axis of the contact pad substantially intersects the centerline of the signal conductor.

10. The electronic system of claim 8 wherein the signal conductor comprises a centerline and wherein the opening center axis of the opening defined by the conductive plane substantially intersects the centerline of the signal conductor.

11. The electronic system of claim 8 wherein the signal conductor comprises a centerline, pad center axis of the contact pad defines a first centerline offset relative to the centerline of the signal conductor, and the opening center axis of the opening defined by the conductive plane defines a second centerline offset relative to the centerline of the signal conductor.

12. The electronic system of claim 8 wherein the contact pad comprises a testing pad that allows attachment of a circuit board testing device to the circuit board.

13. The electronic system of claim 8 wherein the contact pad comprises a circuit board component connection pad that allows attachment of a circuit board component to the circuit board.

14. The electronic system of claim 8, wherein:
the opening defined by the conductive plane extends from a first face of the second signal layer facing the nonconductive layer to a second face of the second signal layer, the second face of the second signal layer opposing the first face of the first signal layer; and
the nonconductive layer being disposed across the first face of the second signal layer such that the nonconductive layer covers the opening defined by the conductive plane.

15. A circuit board comprising:
a first signal layer having a signal conductor means and a contact pad means in electrical communication with the signal conductor;
a second signal layer substantially parallel to the first signal layer, the second signal layer having a conductive plane defining an opening means for substantially normalizing an impedance of the signal conductor means and an impedance of the contact pad means, the opening means substantially aligned with the contact pad means, and the opening means minimizing a signal reflection of a signal transmitted through the signal conductor means and across the contact pad means; and
a nonconductive layer disposed between the first signal layer and the second signal layer;
wherein the contact pad means comprises a pad center axis and wherein the opening means, defined by the conductive plane, comprises an opening center axis, the pad center axis substantially perpendicular to the first signal layer, the opening center axis substantially perpendicular to the second signal layer, and the pad center axis and the opening center axis oriented substantially parallel and defining an offset distance between the pad center axis and the opening center axis;
wherein the opening means defined by the conductive plane comprises an opening diameter and wherein the contact pad means comprises a pad diameter, the opening diameter being at least equal to the contact pad diameter.

16. The circuit board of claim 15 wherein the signal conductor means comprises a centerline, the pad center axis of the contact pad means defines a first centerline offset relative to the centerline of the signal conductor means, and the opening center axis of the opening means defined by the conductive plane defines a second centerline offset relative to the centerline of the signal conductor means.

17. A circuit board comprising:
a first signal layer having a signal conductor and a contact pad in electrical communication with the signal conductor;
a second signal layer substantially parallel to the first signal layer, the second signal layer having a conductive plane defining an opening, the opening substantially aligned with the contact pad, and the opening configured to minimize a signal reflection of a signal transmitted through the signal conductor and across the contact pad; and
a nonconductive layer disposed between the first signal layer and the second signal layer;
wherein the contact pad comprises a pad center axis and wherein the opening, defined by the conductive plane, comprises an opening center axis, the pad center axis substantially perpendicular to the first signal layer, the opening center axis substantially perpendicular to the second signal layer, and the pad center axis and the opening center axis oriented substantially parallel and defining an offset distance between the pad center axis and the opening center axis;
wherein the signal conductor comprises a centerline, the pad center axis of the contact pad defines a first centerline offset relative to the centerline of the signal conductor, and the opening center axis of the opening defined by the conductive plane defines a second centerline offset relative to the centerline of the signal conductor.

18. An electronic system comprising:

a power supply having a voltage terminal and a ground terminal;

an interconnect in electrical communication with the voltage terminal and the ground terminal of the power supply; and a circuit board having:
- a first signal layer having a signal conductor and a contact pad in electrical communication with the signal conductor,
- a second signal layer substantially parallel to the first signal layer, the second signal layer having a conductive plane defining an opening, the conductive plane in electrical communication with one of the voltage terminal and the ground terminal of the power supply through the interconnect, the opening substantially aligned with the contact pad, and the opening configured to minimize a signal reflection of a signal transmitted through the signal conductor and across the contact pad, and
- a nonconductive layer disposed between the first signal layer and the second signal layer;
- wherein the contact pad comprises a pad center axis and wherein the opening, defined by the conductive plane, comprises an opening center axis, the pad center axis substantially perpendicular to the first signal layer, the opening center axis substantially perpendicular to the second signal layer, and the pad center axis and the opening center axis oriented substantially parallel and defining an offset distance between the pad center axis and the opening center axis;
- wherein the signal conductor comprises a centerline, the pad center axis of the contact pad defines a first centerline offset relative to the centerline of the signal conductor, and the opening center axis of the opening defined by the conductive plane defines a second centerline offset relative to the centerline of the signal conductor.

19. A circuit board comprising:

a first signal layer having a signal conductor means and a contact pad means in electrical communication with the signal conductor;

a second signal layer substantially parallel to the first signal layer, the second signal layer having a conductive plane defining an opening means for substantially normalizing an impedance of the signal conductor means and an impedance of the contact pad means, the opening means substantially aligned with the contact pad means, and the opening means minimizing a signal reflection of a signal transmitted through the signal conductor means and across the contact pad means; and a nonconductive layer disposed between the first signal layer and the second signal layer;

wherein the contact pad means comprises a pad center axis and wherein the opening means, defined by the conductive plane, comprises an opening center axis, the pad center axis substantially perpendicular to the first signal layer, the opening center axis substantially perpendicular to the second signal layer, and the pad center axis and the opening center axis oriented substantially parallel and defining an offset distance between the pad center axis and the opening center axis;

wherein the signal conductor means comprises a centerline, the pad center axis of the contact pad means defines a first centerline offset relative to the centerline of the signal conductor means, and the opening center axis of the opening means defined by the conductive plane defines a second centerline offset relative to the centerline of the signal conductor means.

* * * * *